Dec. 24, 1963 A. FELLER ETAL 3,115,585

LOGIC CIRCUIT WITH INDUCTIVE SELF-RESETTING OF NEGATIVE RESISTANCE DIODE OPERATING STATE

Filed March 8, 1961 2 Sheets-Sheet 1

INVENTORS
ALBERT FELLER &
HARRY DITKOFSKY
BY Samuel Cohen
ATTORNEY

INVENTORS
ALBERT FELLER &
HARRY DITKOFSKY
BY Samuel Cohen
ATTORNEY

United States Patent Office 3,115,585

Patented Dec. 24, 1963

3,115,585

LOGIC CIRCUIT WITH INDUCTIVE SELF-RESETTING OF NEGATIVE RESISTANCE DIODE OPERATING STATE

Albert Feller, Riverton, and Harry Ditkofsky, Haddonfield, N.J., assignors to Radio Corporation of America, a corporation of Delaware Filed Mar. 8, 1961, Ser. No. 94,350
14 Claims. (Cl. 307—88.5)

The present invention relates to a negative resistance diode-transistor hybrid circuit which, while not restricted thereto, is especially useful in data processing equipment.

An object of the invention is to provide a simple, high speed logic circuit for a digital computer.

Another object of the invention is to provide a new and improved inverter.

Another object of the invention is to provide a high speed logic circuit which automatically resets to its original condition when the input signal to the circuit is removed.

Another object of the invention is to provide bistable circuits which can be triggered by positive going or negative going set and reset pulses.

The circuit of the invention includes a pair of branch circuits connected in parallel. One of the branch circuits comprises a voltage controlled, negative resistance element such as a tunnel diode connected in series with the emitter-to-base diode of a transistor. The other branch circuit includes an inductance in series with an element such as a positive resistance diode which has a low impedance at a voltage corresponding to the valley region of the series connected diodes. A quiescent current is supplied to the two branch circuits at a level to place the negative resistance diode in the high current region of its low voltage state. A forward current signal may be applied to the two parallel circuits at a level to switch the negative resistance diode to its high voltage state.

Initially the branch circuit including the negative resistance diode draws relatively high current and the branch circuit including the inductor draws relatively low current. When a forward signal current is applied to the two branch circuits, the negative resistance diode switches to its high state and momentarily draws high current. After a short interval of time determined by the time constant associated with the inductor, the branch circuit including the inductor begins to draw more current and the branch circuit including the negative resistance diode draws less current. When equilibrium is reached, the current passing into the branch circuit including the negative resistance diode has decreased to a relatively low value and the current passing into the branch circuit including the inductor has increased to a relatively large value.

When the input signal is removed, the current through the inductor remains at its relatively high value momentarily. Accordingly, the current into the branch circuit including the negative resistance diode decreases and the negative resistance diode automatically resets to its low voltage state. At equilibrium, shortly thereafter, the current into the branch circuit including the inductor decreases to its original low value and the current into the other branch circuit including the negative resistance diode increases to its former high value.

The invention is described in greater detail below and is illustrated in the following drawing of which:

Figure 1:
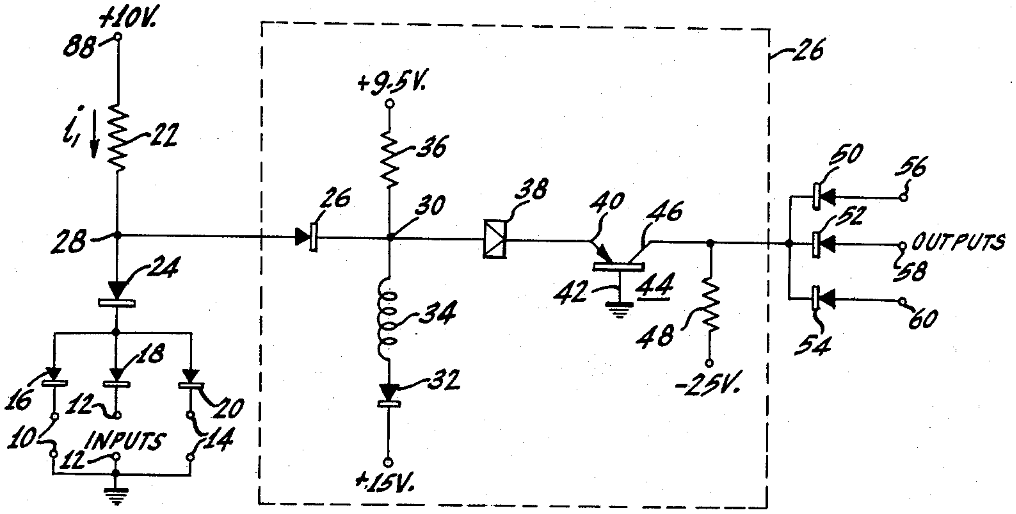
FIG. 1 is a schematic circuit diagram of a preferred form of the present invention.

The circuit shown in FIG. 1 is a three input "nor" gate. An input voltage of the order of −1 or more volts represents the binary digit "one"; an input voltage of the order of approximately zero volts represents the binary digit "zero." The "nor" circuit of FIG. 1 produces a binary "one" output when all of the inputs represent binary "zero" and a binary "zero" output when one or more of the inputs represent the binary digit "one."

The circuit of FIG. 1 includes three input terminals 10, 12 and 14. Positive resistance diodes 16, 18 and 20, which may be germanium diodes, are connected to the three input terminals, respectively. A forward current is applied to the three diodes from the 10 volt source through load resistor 22 and diode 24. Diode 24 may be a silicon, positive resistance diode.

The circuit within dashed block 25 may be considered an inverter. It includes a positive resistance diode 26, which may be a germanium diode, connected at its anode to terminal 28 and at its cathode to terminal 30. A positive resistance diode 32 and inductor 34 are connected in series between a +0.15 voltage source and terminal 30 with the cathode of the diode 32 connected for reverse bias to the positive +0.15 volt terminal. A load resistor 36 is connected between a +9.5 volt source and terminal 30. Tunnel diode 38 and the emitter 40 to base 42 diode of a PNP transistor 44 are connected in series between terminal 30 and ground, the diode 38 cathode being connected to the emitter.

Inductor 34 and diode 32 constitute a first branch circuit and tunnel diode 38 and the emitter-to-base diode 40 and 42 of transistor 44 constitute a second branch circuit. The two branch circuits are connected in parallel. Diode 32 may be a germanium diode which is biased as shown or it may be a silicon diode connected at its cathode to ground. As is explained in more detail later, the circuit is such that diode 32 exhibits low resistance at a voltage corresponding to the valley region of the branch circuit including tunnel diode 38 and the emitter-to-base diode 40, 42 and high resistance at a voltage corresponding to the low state of the tunnel diode.

The collector 46 of the transistor is connected through resistor 48 to a −2.5 volt supply. The collector is also connected through diodes 50, 52 and 54 to output terminals 56, 58 and 60, respectively.

Figure 2:
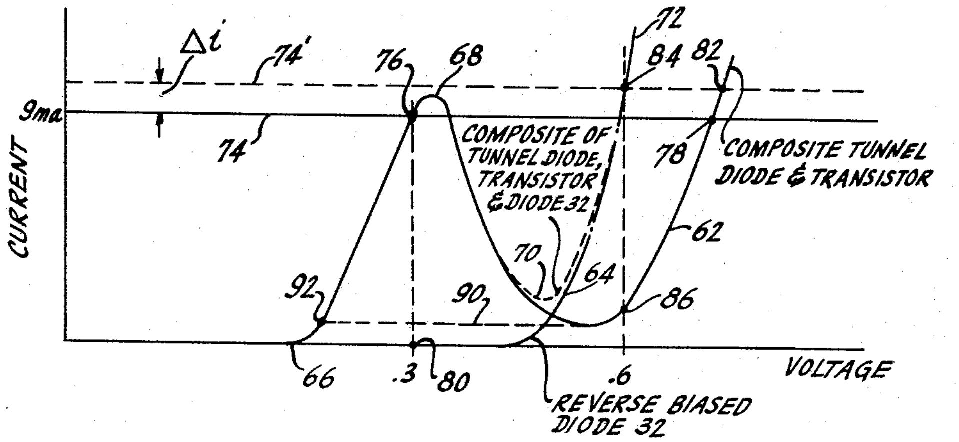
FIG. 2 is a characteristic curve of current versus voltage for certain of the circuit elements in FIG. 1.

The operation of the circuit of FIG. 1 may be better understood by referring to the characteristic curves of current versus voltage shown in FIG. 2. The characteristic curve of current versus voltage for the tunnel diode 38 in series with the emitter-to-base diode of the transistor is shown by solid line 62. The characteristic curve of current versus voltage for the shunt diode 32 is shown by solid line 64. Note that the low resistance region of the diode 32, that is, the region in which the diode conducts relatively heavy forward current, occurs in a voltage range in which the second branch circuit 38, 40, 42 conducts low current. The composite characteristic of the two branch circuits connected in parallel looking from terminal 30 toward ground is shown at 66, 68, 70, 72.

In operation of the circuit of FIG. 1, the quiescent current to the two branch circuits is applied through a relatively large resistor 36. Accordingly, the source can be considered to be a substantially constant current source and the load line is ideally as shown at 74 in FIG. 2. Load line 74 intersects the positive resistance operating regions of branch circuit 38, 40, 42 at 76 and 78. These intersections represent stable operating points and it may be assumed that the circuit is initially operating at 76. At this operating point, the current into the tunnel diode and transistor is high (about 9 milliamperes as viewed in the figure). Accordingly, the transistor conducts heavily and the output voltage available at the collector 46 is close to zero volts. This represents the binary digit "zero." This condition exists as long as any one or more of the input terminals 10, 12, 14 is maintained at −1 volt corresponding to the binary digit "one." As can readily be seen in FIG. 2, when the circuit operating point is at 76, the current through the inductor 34 and diode 32 is as shown at operating point 80—practically zero current.

When input terminals 10, 12 and 14 are all raised to zero volts simultaneously, the current $i_1$, which formerly flowed through diode 24, is now steered into the circuit which includes coupling diode 26. When the current reaches terminal 30, it can go into the first branch circuit (the one including the inductor) or it can go into the second branch circuit (the one including tunnel diode 38). However, the current flowing through an inductor cannot easily be changed, instantaneously. Accordingly, momentarily all of the input current flowing through diode 26 to terminal 30 flows into the second branch circuit, that is, the one containing tunnel diode 38. The effect of this current is illustrated by a shift in the load line from position 74 to position 74′, a current increment of $\Delta i$. The shifted load line 74′ no longer intersects the low voltage state 66, 68 of the second branch circuit. Accordingly, the circuit operating point switches from 76 in the low voltage state to 82 in the high voltage state. Note that diode 32 is not conducting at this time so that curve 64 need not be considered.

The operating point remains at 82 during a short interval of time determined by the $L/R$ time constant associated with inductor 34. Thereafter, the current through the inductor 34 begins to increase in view of the increased voltage at terminal 30. After about 10 millimicroseconds, with a circuit having the constants given later, the circuit reaches equilibrium and the operating point changes from 82 to 84. At operating point 84, the current flowing through the inductor 34 and into the diode 32 is relatively high—about 10 milliamperes less the current flowing into the tunnel diode 38. The current flowing into the tunnel diode is that which flows at operating point 86 in the valley region of the second branch circuit. This may be of the order of 1 milliampere or less. Accordingly, the current flowing into the emitter of the transistor is also a milliampere or less and the transistor output voltage, that is, the voltage available at the collector 46 goes negative to the extent of −2 volts or so. This output voltage represents the binary digit "one." (If desired, a biased diode clamp may be connected to the collector to clamp the output voltage to −1 volt when the transistor conducts.)

When one of the input signals applied to terminal 10 returns to −1 volt (representing the binary digit "one"), the current from the 10 volt source connected to terminal 88 flows mainly through diode 24 again. Diode 26 is thereby cut off and the current available at terminal 30 decreases. When the current available at terminal 30 decreases, the current through the inductor 34 momentarily remains at its relatively high value as indicated by the intersection of load line 74′ and the curve 64. Accordingly, the decrease in current instantaneously occurs through the tunnel diode 38. The circuit operating point therefore instantaneously shifts from point 86 on the composite tunnel diode-transistor characteristic along a line such as dashed load line 90 to operating point 92. This corresponds to the switching of the tunnel diode 38 to the low current region of its low state.

Shortly after the switching of the tunnel diode to its low voltage state, the current through the inductor 34 and diode 32 begins to decrease and eventually reaches zero amperes and the current flowing into the tunnel diode 38 begins to increase until it reaches the current indicated by operating point 76. At this operating point, the transistor 44 conducts heavily and a voltage indicative of the binary "zero" appears at the output terminals.

Summarizing the operation described above, when one or more of the input signals to the circuit represents the binary digit "one," transistor 44 conducts heavily and produces an output representing the binary digit "zero." When all of the inputs to the circuit of FIG. 1 represent the binary digit "zero," tunnel diode 38 switches to its high state, transistor 44 conducts little current and the circuit output represents the binary digit "one." When one or more of the inputs returns to a voltage indicative of the binary digit "one," the circuit of FIG. 1 automatically resists in that the tunnel diode 38 returns to the high current region of the low voltage state, the transistor 44 conducts heavily again, and the circuit output represents the binary digit "zero."

A typical circuit according to FIG. 1 may have the following circuit parameters. These are meant to be illustrative only and are not to be taken as limiting.

Voltages—indicated in the figure.
Diodes 16, 18, 20, 26, 50, 52 and 54—germanium.
Diode 24—silicon.
Diode 32—germanium, reverse biased at +0.15 volt or silicon with cathode connected to ground.
Tunnel diode 38—germanium, with 10 milliampere peak or gallium arsenide. In the latter case, the bias voltage applied to diode 32 is increased sufficiently so that diode 32 exhibits low resistance in the valley region of the branch circuit of the tunnel diode 38 and transistor 44.
Transistor 44—PNP type 2N695 or 2N501, or 2N769. An NPN transistor may be used instead with appropriate circuit changes.
Resistor 22—8,200 ohms.
Resistor 36—1,000 ohms.
Inductor 34—0.1 to 0.4 microhenries.
Resistor 48—390 ohms.

With the circuit described, it was found that the delay between an input signal to terminal 30 and an output signal at the collector 46 was about 5 to 7 millimicroseconds with a 2N501 transistor and 4 to 6 millimicroseconds with a 2N769 transistor. Approximately the same delay occurred between the lagging edges of the input and output signals. The current gain of the circuit was found to be between 8 and 12.5, depending upon loading conditions. The circuit was operated at repetition rates extending from 1,000 cycles per second to 10 megacycles.

Figure 3:
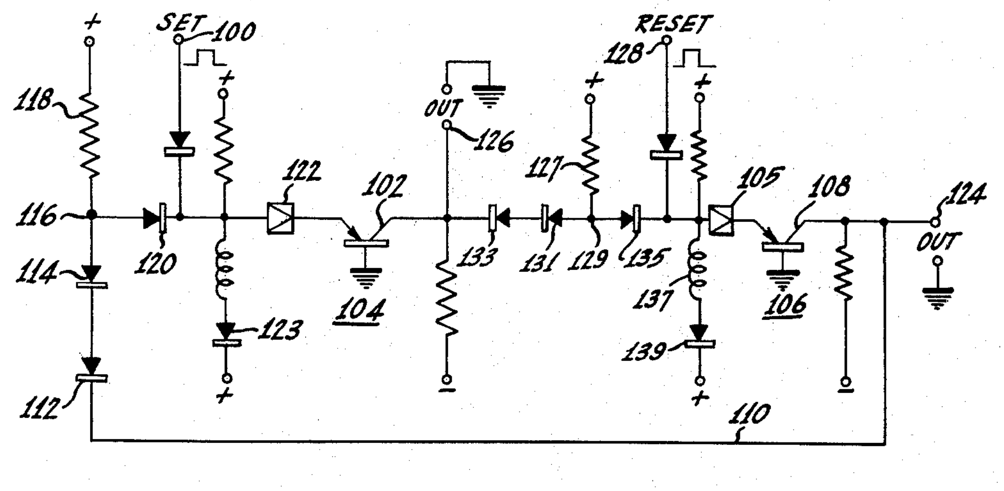
FIGS. 3 and 4 are schematic circuit diagrams of flip-flops according to the present invention.

The circuit shown in FIG. 3 is a flip-flop which incorporates the circuit shown in FIG. 1. When a positive going set pulse is applied to terminal 100, tunnel diode 122 is switched to its high voltage state. Initially, the current flowing into the tunnel diode is high. Shortly thereafter, current begins to flow through the shunt diode 123 and the current into the tunnel diode decreases correspondingly, as already described. Now the tunnel diode is in the low current region of the high state, and the collector 102 of the transistor 104 is negative.

When collector 102 goes negative, current flowing through resistor 127 to junction 129 is steered mainly into diodes 131 and 133, rather than through diode 135. As a result, the current available for tunnel diode 105 momentarily reduces to a value lower than that which will support operation in the high state. The tunnel diode 105, therefore, momentarily switches to the low current region of the low state. Thereafter, the current, flowing through inductor 137 and diode 139 decreases and the current into tunnel diode 105 increases. The tunnel diode now operates in the high current region of the low state and transistor 106 conducts heavily. As a result, collector 108 assumes a voltage close to ground.

When collector 108 assumes a voltage close to ground, diodes 112 and 114 in the feedback path 110 are driven toward cut-off. The current flowing through resistor 118 to junction 116, therefore, steers mainly into the circuit branch including diode 120 and tunnel diode 122 remains in the high state.

Summarizing, when a set pulse is applied to terminal 100, transistor 104 is driven to its low current conducting state and transistor 106 is driven to its high current conducting state. Feedback via 110 maintains the transistors in these states. A positive reset pulse applied to terminal 128 reverses the states of the transistors. An output is available at terminal 124 and a second output is available at terminal 126.

Figure 4:
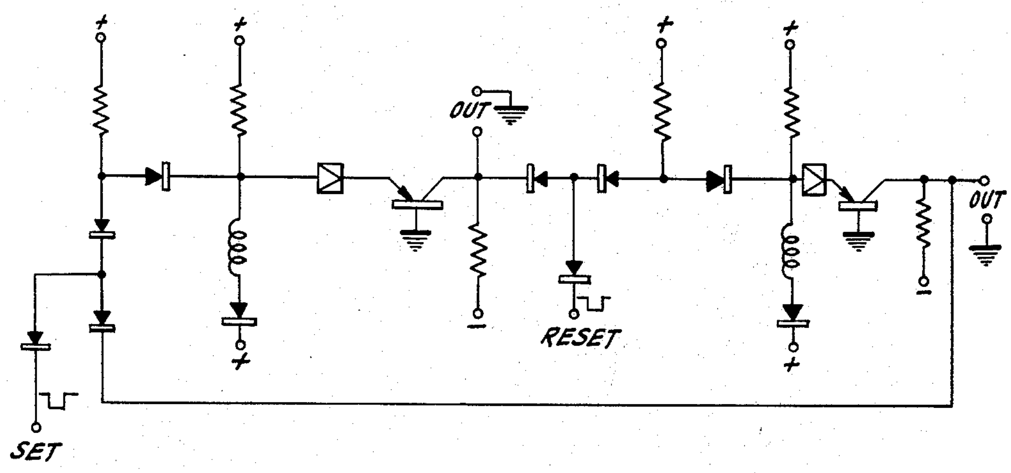

The circuit of FIG. 4 is the same as the one of FIG. 3, except that the set and reset terminals are so located that negative pulses may be employed rather than the positive pulses of FIG. 3.

What is claimed is:

1. In combination, a pair of branch circuits connected in parallel, one including a voltage controlled negative resistance diode in series with the emitter-to-base diode of a transistor, and the other including an inductance in series with a positive resistance diode.

2. In combination, a pair of branch circuits connected in parallel, one including a voltage controlled negative resistance diode in series in the forward direction with the emitter-to-base diode of a transistor, and the other including an inductance in series with a positive resistance diode, the positive resistance diode being poled in the same direction as the negative resistance diode, and the positive resistance diode exhibiting a low impedance in a voltage range corresponding to a high impedance exhibited by the series connected negative resistance diode and emitter-to-base diode.

3. In combination, a pair of branch circuits connected in parallel, the first including a tunnel diode in series in the forward direction with the emitter-to-base diode of a transistor, and the second including an inductance in series with a positive resistance diode, the positive resistance diode exhibiting a low forward resistance in the region in which the tunnel diode and emitter-to-base diode in series exhibit a high forward resistance in the high state of the tunnel diode; means for quiescently biasing said two branch circuits at a level to place the tunnel diode in the high current region of its low voltage state; and means for applying a forward signal current to the two parallel circuits at a level to switch the tunnel diode to its high state.

4. In the combination as set forth in claim 3, said tunnel diode comprising a germanium tunnel diode and said positive resistance diode comprising a reverse biased germanium diode.

5. In the combination as set forth in claim 3, said tunnel diode comprising a germanium tunnel diode and said positive resistance diode comprising a silicon diode.

6. In combination, a pair of branch circuits connected in parallel, one including a voltage controlled negative resistance diode in series with the emitter-to-base diode of a transistor, and the other including an inductance in series with a positive resistance element which exhibits a high resistance at voltages corresponding to the low voltage state of the negative resistance diode and a low resistance at voltages in the high resistance voltage range of the series connected diodes of the one branch circuit.

7. In combination, a pair of branch circuits connected in parallel, one including a voltage controlled negative resistance diode in series in the forward direction with the emitter-to-base diode of a transistor, and the other including an inductance in series with a positive resistance element of the type which exhibits a high resistance at voltages corresponding to the low voltage state of the negative resistance diode and a low resistance at voltages in the high resistance voltage range of the series connected diodes of the one branch circuit; means for applying an operating voltage to the transistor; means for applying a bias voltage in the forward direction to said one branch circuit; and means for applying input signals to said branch circuits.

8. In the combination as set forth in claim 7, said positive resistance element comprising a diode.

9. A logic circuit comprising, in combination; a plurality of input connections, each for receiving a voltage indicative of a binary digit; a common input terminal; a current source connected to said common terminal; a two terminal coupling element connected at one terminal to said common terminal; a pair of branch circuits connected in parallel to the other terminal of said coupling element, one including a voltage controlled negative resistance diode in series, in the forward direction with the emitter-to-base diode of a transistor, and the other including an inductor in series with a positive resistance element which exhibits a high resistance at voltages corresponding to the low voltage state of the negative resistance diode, and a low resistance at voltages at which the negative resistance diode exhibits a high resistance; means for supplying an operating voltage to the transistor; means for supplying a forward bias current for said one branch circuit to said other terminal of said coupling element; and a circuit including elements interconnecting said input connections to said common input terminal for steering the current from said source through said coupling element and into said branch circuits when the voltages applied to said input connections represent certain binary digits.

10. A logic circuit comprising, in combination, a plurality of input connections, each for receiving a voltage indicative of a binary digit; a common input terminal; a current source connected to said common terminal; a positive resistance coupling diode connected in a sense to conduct said forward current between said common terminal and a second terminal; a pair of branch circuits connected in parallel to said second terminal, one including a voltage controlled negative resistance diode in series, in the forward direction with the emitter-to-base diode of a transistor, and the other including an inductor in series with a positive resistance element which exhibits a high resistance at voltages corresponding to the low voltage state of the negative resistance diode, and a low resistance at voltages at which the negative resistance diode exhibits a high resistance; means for supplying an operating voltage to the transistor; means for supplying a forward bias current for said one branch circuit to said second terminal; and a circuit including elements interconnecting said input connections to said common connection for normally maintaining said coupling diode cut off for rendering said coupling diode conductive when the voltages applied to said input connections represent certain binary digits.

11. A flip-flop comprising, in combination, two pairs of branch circuits, each including a first branch with a voltage controlled negative resistance diode in series in the forward direction with the emitter-to-base diode of a transistor, and a second branch with an inductor in series with a positive resistance diode poled in the same direction as the negative resistance diode; and a circuit connecting the collector of the transistor in each pair of branch circuits to the negative resistance diode in the other branch circuit.

12. A flip-flop comprising, in combination, two pairs of branch circuits, each extending between an input terminal and ground, and each said pair including a first branch with a tunnel diode in series in the forward direction with the emitter-to-base diode of a transistor the base of which is connected to ground, and a second branch circuit with an inductor in series with a positive resistance diode poled in the same direction as the tunnel diode; a pair of circuits, each connecting the collector of a transistor in one branch circuit to the input terminal of the other branch circuit; means connected to each transistor for supplying an operating voltage thereto; a current source connected to each input terminal for supplying a forward current to each pair of branch circuits; a set terminal connected to said first branch circuit to which a voltage may be applied for switching the tunnel diode therein from one state to another; and a reset terminal connected to the second branch circuit to which a voltage may be applied for switching the tunnel diode therein from one state to another.

13. A "nor" circuit comprising, in combination; a plurality of input connections, each for receiving a voltage indicative of a binary digit; a common input terminal; a current source connected to said common terminal; a positive resistance coupling diode connected in a sense to conduct said forward current between said common terminal and a second terminal; a pair of branch circuits connected in parallel between said second terminal and ground, one including a voltage controlled negative resistance diode in series, in the forward direction with the emitter-to-base diode of a transistor, and the other including an inductor in series with a positive resistance element which exhibits a high resistance at voltages corresponding to the low voltage state of the negative resistance diode, and a low resistance at voltages at which the negative resistance diode exhibits a high resistance; means for supplying an operating voltage to the transistor; means for supplying a forward bias for said one branch circuit to said second terminal; and a circuit including elements interconnecting said input connections to said common connection for normally maintaining said coupling diode cut off and for rendering said coupling diode conductive when the voltages applied to said input connections all represent the binary digit "zero."

14. In combination, a pair of branch circuits connected in parallel, one including a tunnel diode in series in the forward direction with the emitter-to-base diode of a transistor, and the other including an inductance in series with a positive resistance element of the type which exhibits a high resistance at voltages corresponding to the low voltage state of the negative resistance diode and a low resistance at voltages in the high resistance voltage range of the series connected diodes of the one branch circuit; means for applying an operating voltage to the collector of the transistor; means for applying a bias voltage in the forward direction to said one branch circuit; a third branch circuit; a current source which normally applies a current to said third branch circuit; an impedance element which normally exhibits a high impedance connecting said third branch circuit to said pair of branch circuits; and means in said third branch circuit responsive to input signals for changing the impedance of said element to a relatively low value and steering the current from said source through said element and into said pair of branch circuits.

References Cited in the file of this patent

UNITED STATES PATENTS

| | | |
|---|---|---|
| 2,557,729 | Eckert | June 19, 1951 |
| 2,829,282 | Hughes et al. | Apr. 1, 1958 |

OTHER REFERENCES

Control Engineering, May 1957 (page 82 relied on).

Amodei et al.: RCA Technical Note No. 434, January 1961, (2 pages) (page 1 relied on).

Amodei et al.: "RCA Technical Note No. 438," January 1961, (3 sheets) (sheet 2 relied on).